United States Patent [19]
Sakai et al.

[11] Patent Number: 5,107,223
[45] Date of Patent: Apr. 21, 1992

[54] PHASE INVERTER AND PUSH-PULL AMPLIFIER USING THE SAME

[75] Inventors: Fuminori Sakai, Yokohama; Hidetake Suzuki, Tokyo, both of Japan

[73] Assignee: Fujitsu Limited, Kawasaki, Japan

[21] Appl. No.: 466,751

[22] Filed: Jan. 18, 1990

[30] Foreign Application Priority Data

Jan. 19, 1989 [JP] Japan .................. 1-8495

[51] Int. Cl.$^5$ ............ H03F 3/30; H01P 5/22
[52] U.S. Cl. ........................ 330/122; 330/275
[58] Field of Search ............. 333/109, 113, 116, 117, 333/120–122, 125, 128, 136, 137, 26, 157, 161; 330/122, 275

[56] References Cited

U.S. PATENT DOCUMENTS

| | | | |
|---|---|---|---|
| 3,996,533 | 12/1976 | Lee | 333/116 X |
| 4,316,160 | 2/1982 | Dydyk | 333/120 |
| 4,578,652 | 3/1986 | Sterns | 333/120 X |
| 4,697,161 | 9/1987 | Buoli | 333/116 |
| 4,749,969 | 6/1988 | Boire et al. | 333/120 |

FOREIGN PATENT DOCUMENTS 56002 3/1987 Japan ................ 333/120

OTHER PUBLICATIONS

S. Toyoda, "Power Combining System Using Two Push Pull Power Amplifiers", The 13th International Conference on Infrared and Millimeter Wave, Dec. 1988, pp. 53–54.

*Primary Examiner*—Paul Gensler
*Attorney, Agent, or Firm*—Staas & Halsey

[57] ABSTRACT

A phase inverter includes first, second, third and fourth terminals, a first coupling circuit coupled between the first and second terminals, a second coupling circuit coupled between the second and third terminals, a third coupling circuit coupled between the third and fourth terminals, and a fourth coupling circuit coupled between the first and fourth terminals. The first to fourth terminals and the first to fourth coupling circuits are arranged into a ring. The first coupling circuit is of a type different from a type of the fourth coupling circuit. The second and third coupling circuits are identical in type. Two output signals having a phase difference of 180° are drawn from the second and fourth terminal when an input terminal is applied to the first terminal, and an output signal is drawn from the first terminal when two input signals having a phase difference of 180° are applied to the second and fourth terminals. A push-pull amplifier using two phase inverter each having the above-mentioned configuration is also provided.

28 Claims, 15 Drawing Sheets

• GROUNDED
○ OPEN

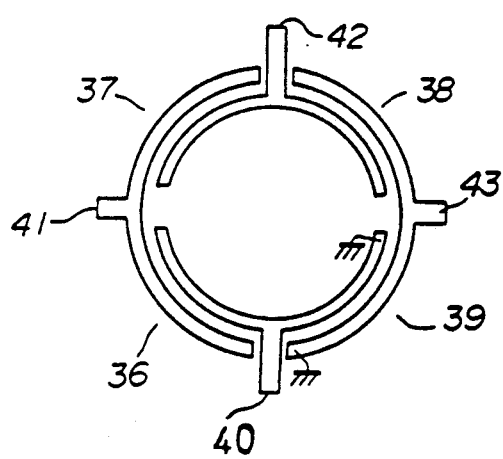
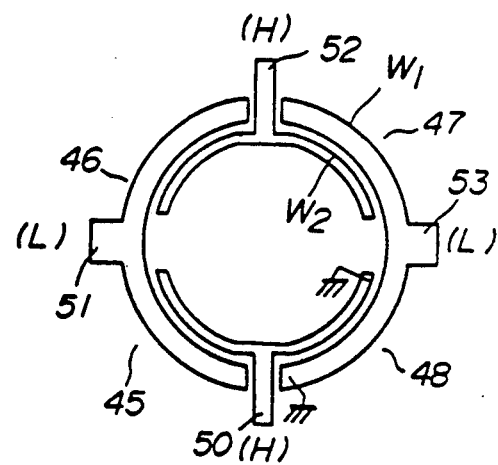
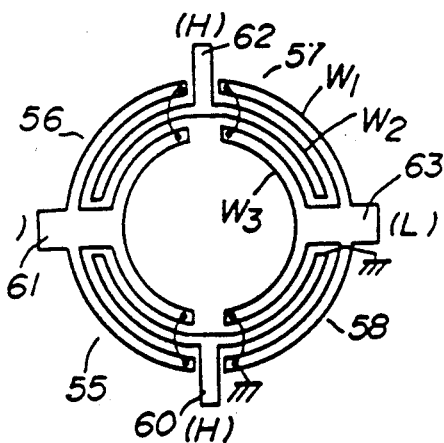
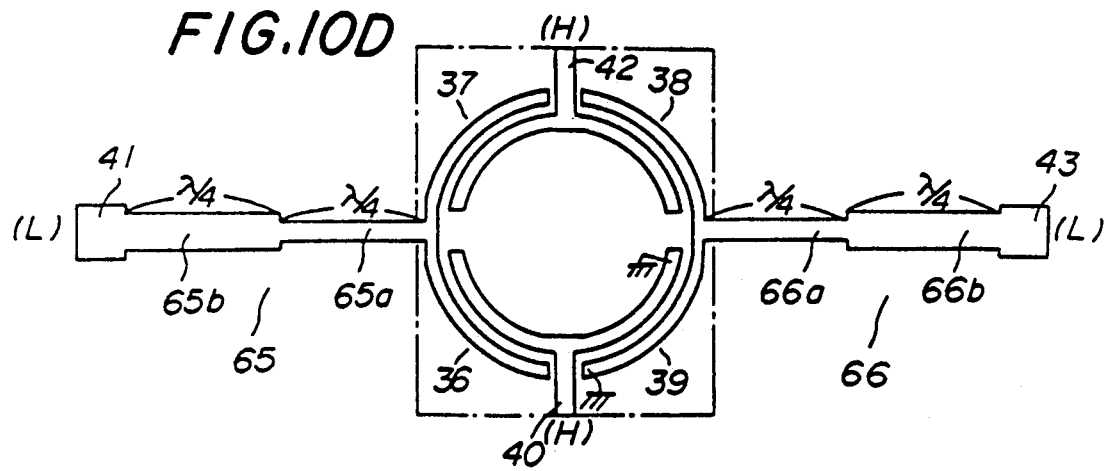

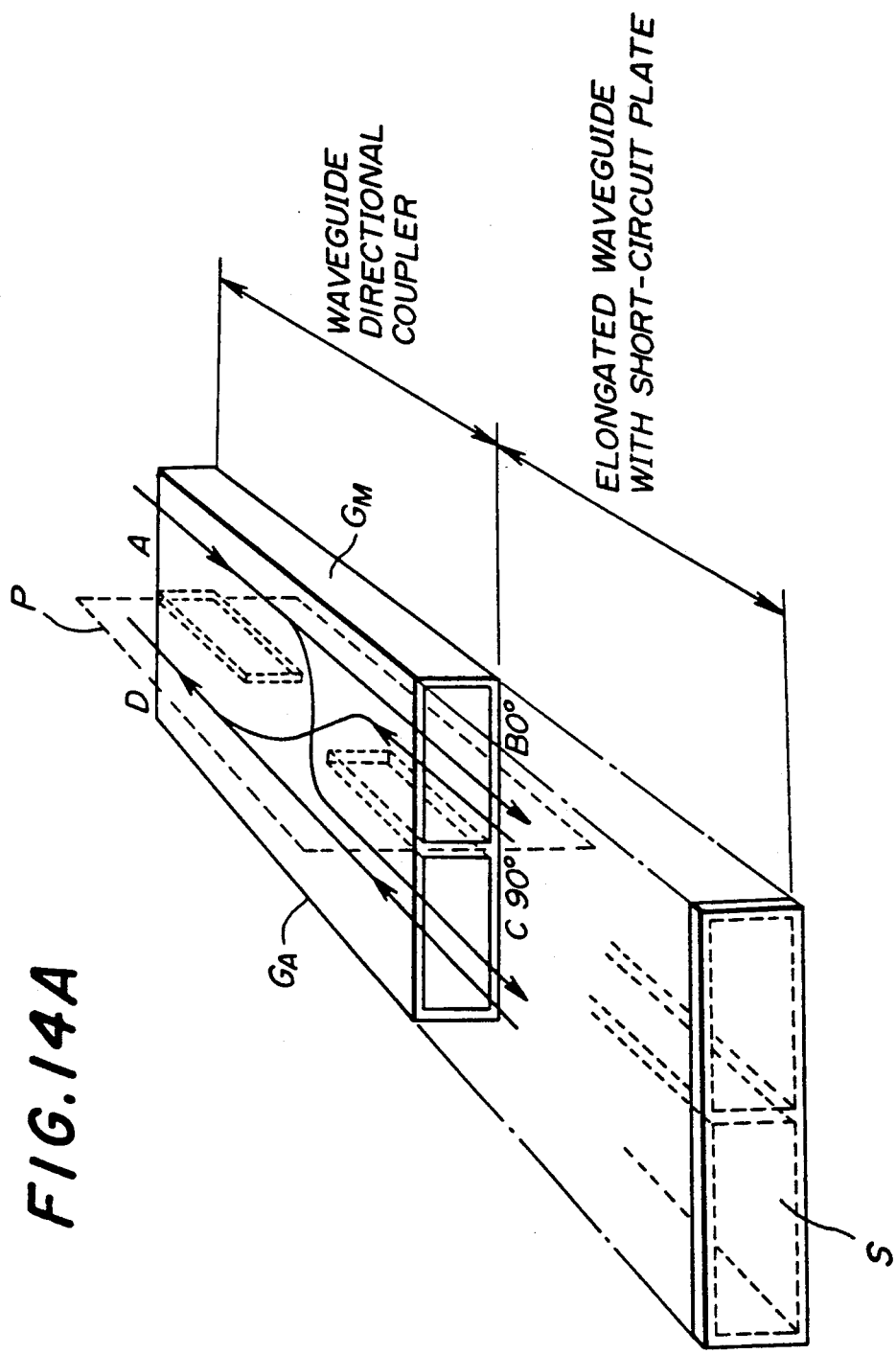

PHASE INVERTER AND PUSH-PULL AMPLIFIER USING THE SAME

BACKGROUND OF THE INVENTION

The present invention generally relates to a phase inverter, and more particularly to a phase inverter which receives a radio frequency signal and derives two radio frequency signals having a phase difference of 180° therefrom. Further, the present invention is directed to a push-pull amplifier using such a phase inverter.

Conventionally, it is known to form a phase inverter by the use of a transformer, a capacitor or an inductor. Such a phase inverter is suitable for a low-frequency range. In other words, the use of a transformer, a capacitor or an inductor is not suitable for a very high frequency range in the order of tens of giga-hertz or higher because of the presence of stray capacitance. From this reason, it is necessary to use a distributed element circuit such as a coupled line network in the range of very high frequencies (microwave range).

Referring to FIG.1, there is illustrated a conventional phase inverter using parallel coupled lines. Ring-shaped transmission lines 2 and 3 formed of a conductive material are arranged on a dielectric substrate 1 so that two networks each composed of two $\lambda/4$ parallel coupled lines are formed ($\lambda$ is the wavelength of a signal applied to the transmission line 3). The transmission line 2 has terminals $4_2$, $4_3$ and $4_4$, and the transmission line 3 has a terminal $4_1$. Two adjacent terminals among the terminals $4_1$, $4_2$, $4_3$ and $4_4$ have a phase difference of 90°. A signal applied to the terminal $4_1$ is equally distributed to the terminals $4_2$ and $4_4$. A signal output from the terminal $4_2$ has the $+90°$ phase difference with respect to the input signal, and a signal output from the terminal $4_4$ has the $-90°$ phase difference with respect to the input signal. Thus, the signals having a phase difference of 180° are output through the terminals $4_2$ and $4_4$. In this case, the signals output from the terminals $4_2$ and $4_4$ are combined together at the terminal $4_3$. However, since the signals at the terminals $4_2$ and $4_4$ are 180° out of phase, no signal is output from the terminal $4_3$.

FIG.2A is a graph of amplitude vs. normalized frequency characteristics of the conventional phase inverter shown in FIG.1, and FIG.2B is a graph of phase vs. normalized frequency characteristics thereof. A curve I is a characteristic of a signal passing from the terminal $4_1$ to the terminal $4_2$. A curve II is a characteristic of a signal passing from the terminal $4_1$ to the terminal $4_4$. It can be seen from FIG.2A that the amplitude characteristic of the signal passing from the terminal $4_1$ to the terminal $4_2$ is approximately flat in the $\pm 0.4f_0$ range where $f_0$ is the center frequency of this signal (equal to 12.5 GHz, for example). On the other hand, the amplitude characteristic of the signal passing from the terminal $4_1$ to the terminal $4_4$ is approximately flat only in the $\pm 0.2f_0$ range. Such a range is narrow and insufficient in view of practical board-band use.

It can be seen from FIG.2B that the phase characteristics of the signal passing from the terminal $4_1$ to the terminal $4_2$ and the signal passing from the terminal $4_1$ to the terminal $4_4$ have a phase difference of 180° in a range of $\pm 0.4f_0$. From the above-mentioned reasons, it is desired to provide a phase inverter in which the amplitude and phase characteristics of two 180° out-of-phase output signals are both flat in a wider frequency range.

SUMMARY OF THE INVENTION

It is a general object of the present invention to provide an improved phase inverter in which the aforementioned disadvantages are eliminated.

A more specific object of the present invention is to provide a phase inverter in which the amplitude and phase characteristics of two output signals having a phase difference of 180° are both flat in a wider very-high frequency range.

The above objects of the present invention are achieved by a phase inverter comprising first, second, third and fourth terminals, a first coupling circuit coupled between the first and second terminals, a second coupling circuit coupled between the second and third terminals, a third coupling circuit coupled between the third and fourth terminals, and a fourth coupling circuit coupled between the first and fourth terminals. The first to fourth terminals and the first to fourth coupling circuits are arranged into a ring. The first coupling circuit is of a type different from a type of the fourth coupling circuit. The second and third coupling circuits are identical in type. Two output signals having a phase difference of 180° are drawn from the second and fourth terminal when an input terminal is applied to the first terminal, and an output signal is drawn from the first terminal when two input signals having a phase difference of 180° are applied to the second and fourth terminals.

Another object of the present invention is to provide a push-pull amplifier using the above-mentioned phase inverter.

This object of the present invention is achieved by a push-pull amplifier comprising a first phase inverter having an input terminal receiving an input signal and two output terminals, a second phase inverter having two input terminals and an output terminal outputting an output signal, a first amplifier coupled between one of the two output terminals of the first phase inverter and one of the two input terminals of the second phase inverter, and a second amplifier coupled between the other output terminal of the first phase inverter and the other input terminal of the second phase inverter. Each of the first and second phase inverters includes first, second, third and fourth terminals, a first coupling circuit coupled between the first and second terminals, a second coupling circuit coupled between the second and third terminals, a third coupling circuit coupled between the third and fourth terminals, and a fourth coupling circuit coupled between the first and fourth terminals. The first to fourth terminals and the first to fourth coupling circuits are arranged into a ring. The first coupling circuit is of a type different from a type of the fourth coupling circuit, and the second and third coupling circuits being identical in type. The first, second, and fourth terminals of the first phase inverter are the input terminal and the two output terminals thereof, respectively. The first, second and fourth terminals of the second phase inverter are the two input terminals and the output terminal thereof, respectively. The third terminals of the first and second phase inverters are grounded through first and second resistors, respectively.

Additional objects, features and advantages of the present invention will become apparent from the following detailed description when read in conjunction with the accompanying drawings.

BRIEF DESCRIPTION OF THE DRAWINGS

FIG.10A is a diagram of a variation of the arrangements shown in FIGS.4A and 4B;

FIGS.10B and 10C are diagrams of modifications of the first and second embodiments, respectively;

FIG.10D is a diagram of an arrangement equivalent to the arrangement shown in FIG.10B;

FIG.14A is a perspective view of a waveguide directional coupler used in the third embodiment of the present invention;

DESCRIPTION OF THE PREFERRED EMBODIMENTS

Figure 3:
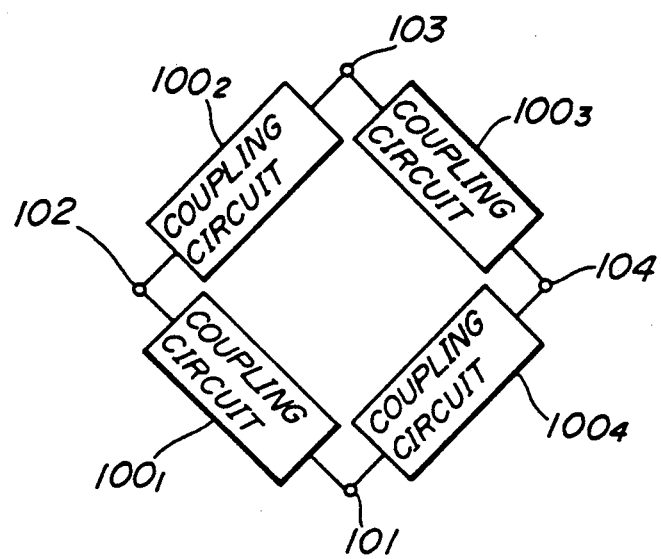
FIG.3 is a diagram illustrating the principle of the present invention.

FIG.3 is a diagram illustrating the principle of the present invention. A phase inverter according to the present invention includes coupling circuits $100_1$, $100_2$, $100_3$ and $100_4$ each formed by λ/4 parallel coupled lines. The coupling circuits $100_1$–$100_4$ are arranged into a ring and coupled to each other through terminals 101, 102, 103 and 104 as shown in FIG.3. When two output signals are derived from an input signal, the terminal 101 serves as an input terminal of the phase inverter, and the terminals 102 and 104 serve as output terminals thereof. When an input signal is applied to the input terminal 101, 180° out-of-phase signals are drawn from the output terminals 102 and 104. No signal is drawn from the terminal 103.

The type of the coupling circuit $100_1$ between the input terminal 101 and the output terminal 102 is different from that of the coupling circuit $100_4$ between the input terminal 101 and the output terminal 104. For example, the coupling circuit $100_1$ is formed by open coupled lines, and the coupling circuit $100_4$ is formed by grounded coupled lines. On the other hand, the type of the coupling circuit $100_2$ is the same as that of the coupling circuit $100_3$. That is, the coupling circuits $100_2$ and $100_3$ are formed by open coupled lines or grounded coupled lines.

Alternatively, the terminals 102 and 104 serve as input terminals, and the terminal 101 serves as an output terminal. In this alternative, two 180° out-of-phase input signals are applied to the terminals 102 and 104 and combined, and an output signal is drawn from the output terminal 101.

Figure 4A:
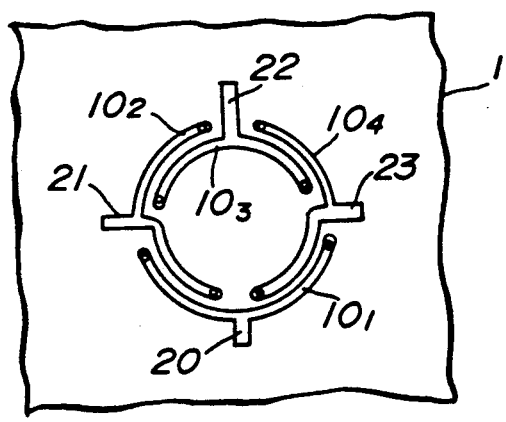
FIG.4A is a diagram of a phase inverter according to a first embodiment of the present invention.

FIG.4A is a plan view of a phase inverter according to a first embodiment of the present invention. The phase inverter includes transmission lines $10_1$, $10_2$, $10_3$ and $10_4$, each of which is in the shape of a substantially half circle. The transmission lines $10_1$–$10_4$ are arranged on a dielectric substrate 1 so as to form a ring. The transmission lines $10_1$, $10_2$, $10_3$ and $10_4$ have terminals 20, 21, 22 and 23, respectively. Opposite portions of adjacent transmission lines form λ/4 parallel coupled lines by which a coupling circuit (network of λ/4 parallel coupled lines) is formed. That is, four coupling circuits or networks are connected through the terminals 20–23 as shown in FIG.4A. In FIG.4A, "o" indicates an open end of a transmission line, and "●" indicates a grounded end of a transmission line.

Figure 5A:
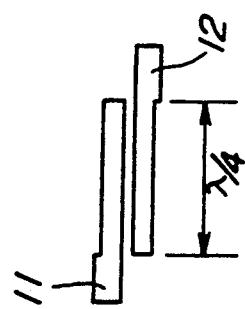
FIGS.5A and 5B are diagrams illustrating λ/4 parallel coupled line networks.
Figure 5B:
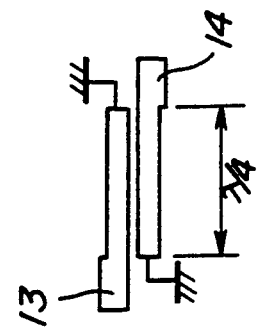

A network composed of λ/4 parallel coupled lines is classified into either a double-end open type or a double-end grounded type. FIG.5A shows a λ/4 parallel coupled line network of the double-end open type, and FIG.5B shows a λ/4 parallel coupled line network of the double-end grounded type. The λ/4 parallel coupled line networks shown in FIGS.5A and 5B function as bandpass filters. The phase difference between a terminal 11 of one of the two transmission lines shown in FIG.5A and a terminal 12 of the other transmission line is equal to +90° at the center frequency $f_0$. There is a −90° phase difference between a terminal 13 of one of the two transmission lines shown in FIG.5B and a terminal 14 of the other transmission line at the center frequency $f_0$.

Turning to FIG. 4A, λ/4 parallel coupled line networks of the double-end open type (coupling circuits) are respectively provided between the terminals 20 and 21, terminals 21 and 22, and terminals 22 and 23. A λ/4 parallel coupled line network of the double-end grounded type (a coupling circuit) is provided between the terminals 20 and 23. The type of the network between the input terminal 20 and the output terminal 21 is different from the type of the network between the input terminal 20 and the output terminal 23. The network between the terminals 21 and 22 is of the same type as the network between the terminals 22 and 23. When the input signal is applied to the input terminal 20, 180° out-of-phase signals having the same amplitude are drawn from the output terminals 21 and 23. Particularly at the center frequency $f_0$, there is a +90° phase difference between the input terminal 20 and the output terminal 21, and a −90° phase difference between the input terminal 20 and the output terminal 23. In an alternative use of the phase inverter shown in FIG. 4A, the terminals 21 and 23 serve as input terminals, and the terminal 20 serves as an output terminal. Two 180° out-of-phase signals applied to the terminals 21 and 23 are combined together so that a combined output signal is obtained at the terminal 20.

Figure 1:
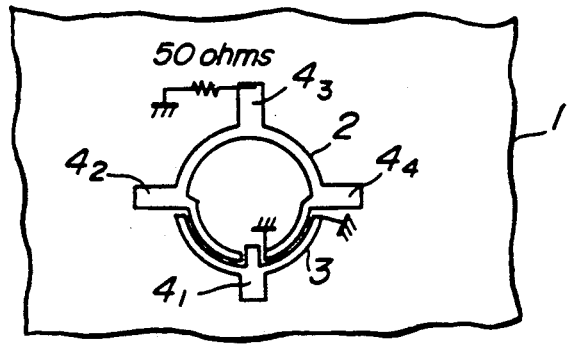
FIG.1 is a diagram of a conventional phase inverter.
Figure 2A:
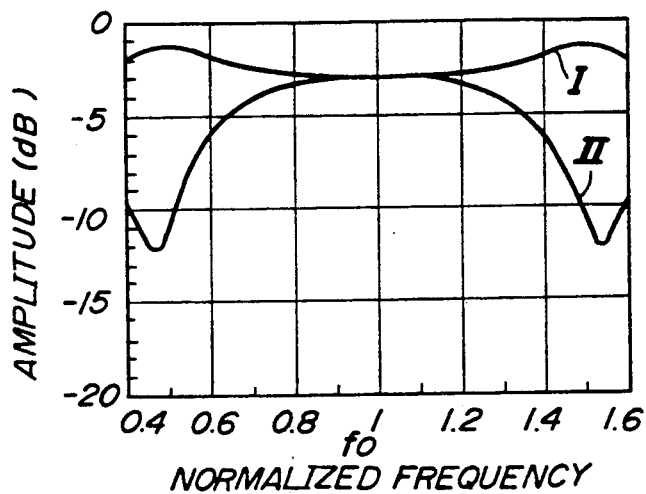
FIG.2A is a graph illustrating amplitude vs. normalized frequency characteristics of the phase inverter shown in FIG.1.
Figure 2B:
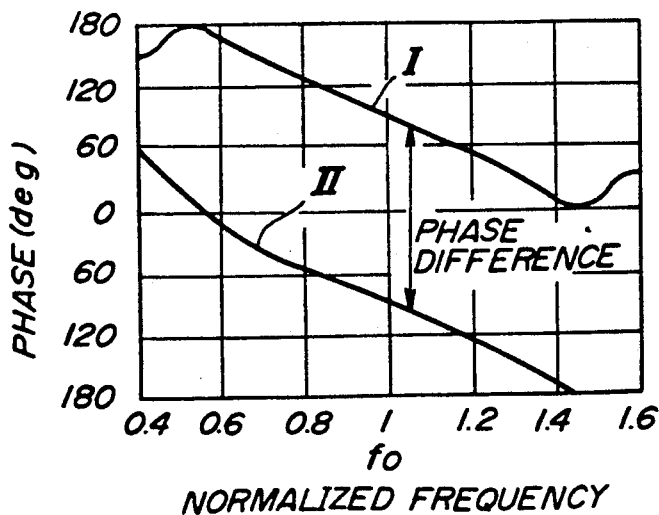
FIG.2B is a graph illustrating phase vs. normalized frequency characteristics of the phase inverter shown in FIG.1.

The first embodiment of the present invention employs four λ/4 parallel coupled line networks provided between the individual adjacent terminals. This arrangement of the first embodiment is apparently distinguishable from the conventional arrangement shown in FIG. 1. The amplitude characteristics of the output signals are flat in an improved range of ±0.3$f_0$.

Figure 4B:
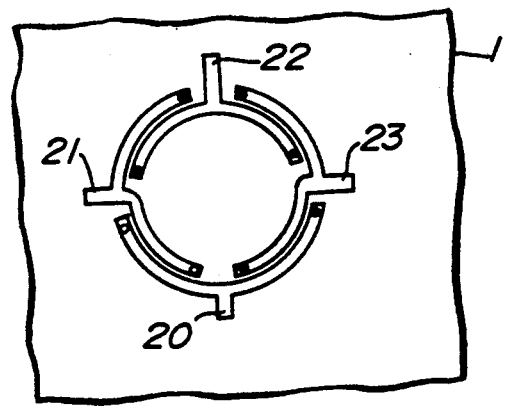
FIG.4B is a diagram of another phase inverter according to the first embodiment of the present invention.

In FIG. 4B, a λ/4 parallel coupled line network of the double-end open type is provided between the input terminal 20 and the output terminal 21, and λ/4 parallel coupled line networks of the double-end grounded type are provided between the terminals 21 and 22, terminals 22 and 23, and terminals 20 and 23. The type of the network between the input terminal 20 and the output terminal 21 is different from the type of the input terminal 20 and the output terminal 23. The arrangement shown in FIG. 4B presents an improved amplitude flat range of ±0.3$f_0$.

Figure 6A:
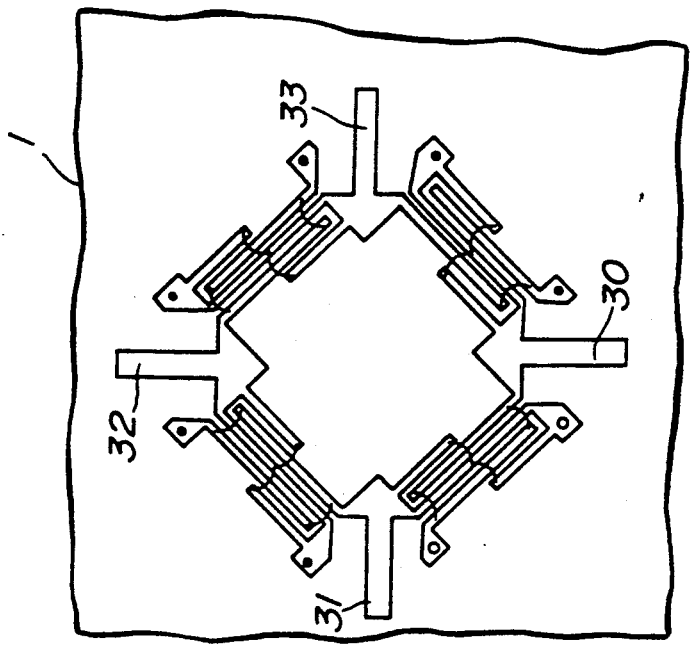
FIG.6A is a diagram of a phase inverter according to a second embodiment of the present invention.
Figure 7:
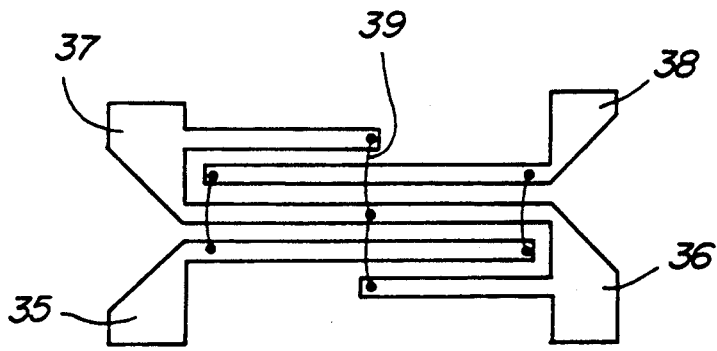
FIG.7 is a diagram of a directional coupler.

FIG. 6A is a diagram of a phase inverter according to a second embodiment of the present invention. The second embodiment uses directional couplers which are networks each composed of parallel coupled lines. Networks (directional couplers) $35_1$, $35_2$, $35_3$ and $35_4$ are of the ring coupler type and are arranged into a ring on the dielectric substrate 1. Terminals 30, 31, 32 and 33 are provided between individual adjacent directional couplers among the directional couplers $35_1$–$35_4$. As shown in FIG. 7, each of the directional couplers $35_1$–$35_4$ has a plurality of comb-shaped interdigital transmission lines. The transmission lines are electrically coupled to alternate transmission lines through conducting jump wires 39. The directional coupler has four terminals 35, 36, 37 and 38. In a directional coupler of the open type, the terminal 35 (couple port) and the terminal 36 (main port) are both open. In a directional coupler of the grounded type, the terminals 35 and 36 are both grounded. In the open type directional coupler, there is a 90° phase difference between the terminal 37 (input port) and the terminal 38 (isolation port) at the center frequency $f_0$. In the grounded type directional coupler, there is a −90° phase difference between the terminals 37 and 38 at the center frequency $f_0$. The directional coupler shown in FIG. 7 itself is known to a person having ordinary skill in the art.

Turning to FIG. 6A, the directional couplers $35_1$, $35_2$ and $35_3$ respectively provided between the terminals 30 and 31, 31 and 32, and 32 and 33 are of the open type, and the directional coupler $35_4$ provided between the terminals 30 and 33 is of the grounded type. When an input signal is applied to the input terminal 30, 180° out-of-phase signals are drawn from the output terminals 31 and 33. Particularly at the center frequency $f_0$, there is a +90° phase difference between the terminals 30 and 31, and a −90° phase difference between the terminals 30 and 33.

Figure 6B:
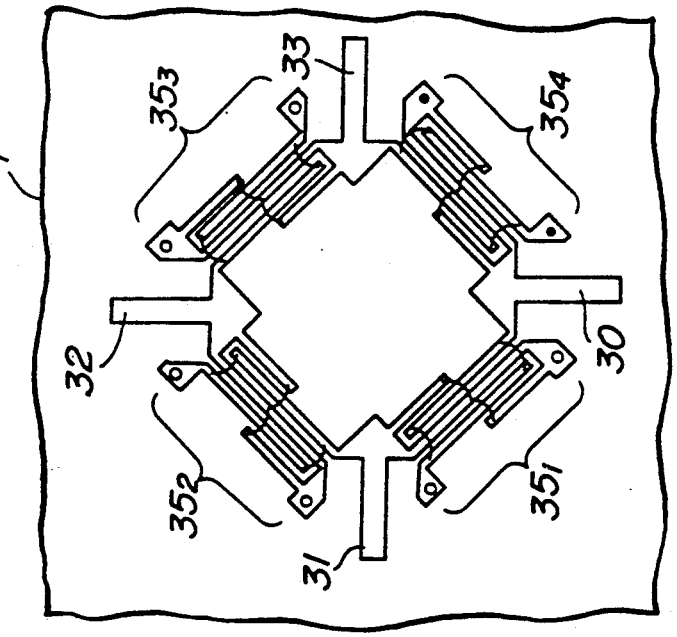
FIG.6B is a diagram of another phase inverter according to the second embodiment of the present invention.

Three directional couplers shown in FIG. 6B provided between the terminals 31 and 32, 32 and 33, and 33 and 30 are of the grounded type, and the remaining directional coupler provided between the terminals 30 and 31 is of the open type. When an input signal is applied to the input terminal 30, 180° out-of-phase signals are drawn from the output terminals 31 and 33. Particularly at the center frequency $f_0$, there is the +90° phase difference between the terminals 30 and 31, and the −90° phase difference between the terminals 30 and 33.

Figure 8A:
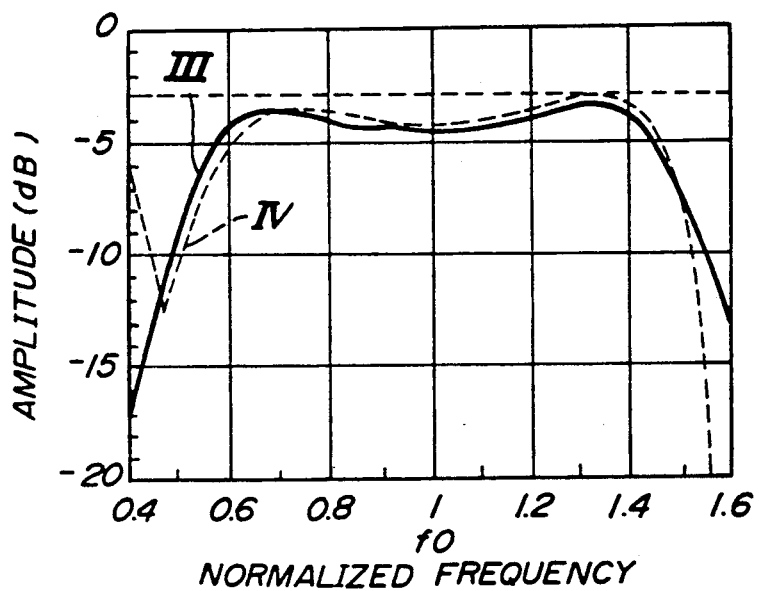
FIG.8A is a graph of amplitude vs. normalized frequency characteristics of the embodiment shown in FIG.6A.
Figure 8B:
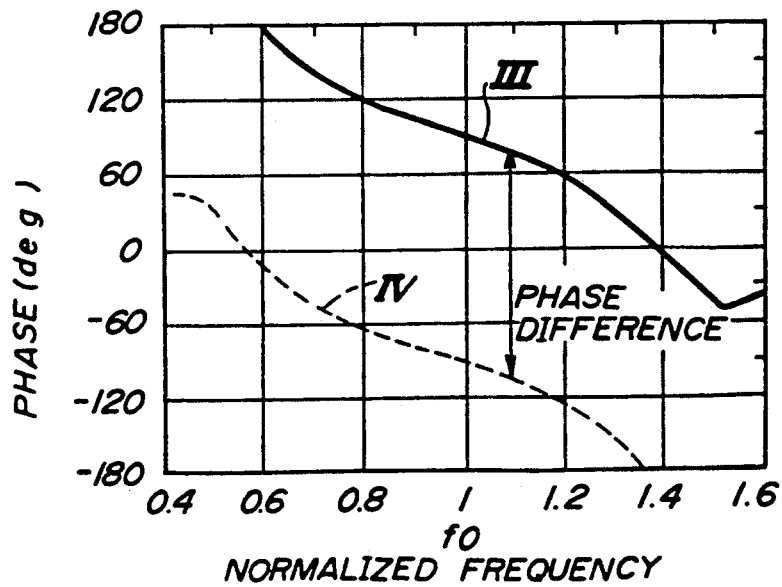
FIG.8B is a graph of phase vs. normalized frequency characteristics of the embodiment shown in FIG.6A.
Figure 9A:
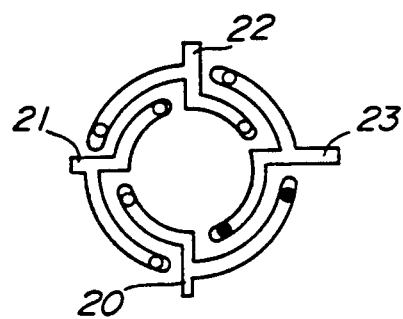
FIGS.9A through 9D are diagrams of variations of the arrangements shown in FIGS.4A and 4B.
Figure 9B:
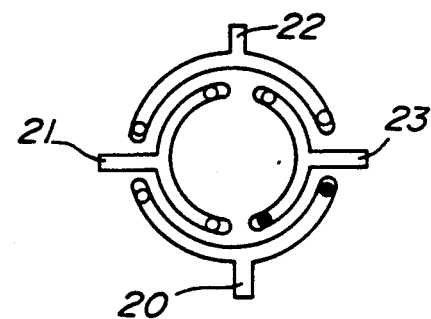
Figure 9C:
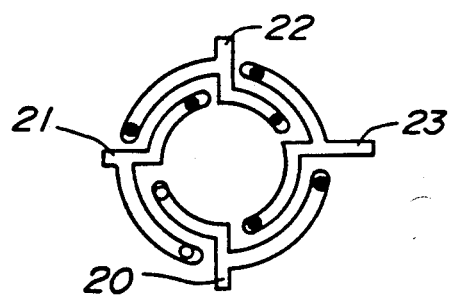
Figure 9D:
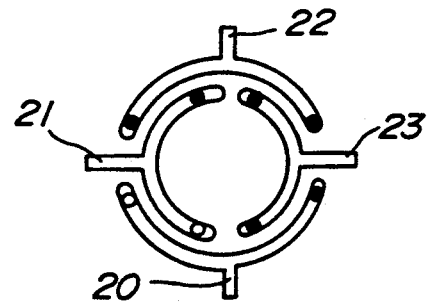

FIG. 8A is a graph illustrating amplitude vs. normalized frequency characteristics of signals passing through the phase inverter shown in FIG. 6A. FIG. 8B is a graph illustrating phase vs. normalized frequency characteristics of signals passing therethrough. A curve III shows frequency characteristics of a signal passing from the input terminal 30 to the output terminal 31, and a curve IV shows frequency characteristics of a signal passing from the input terminal 30 to the output terminal 33. The amplitude characteristics of the signals III and IV are both flat in the ±0.4$f_0$ range (the center frequency $f_0$ is 12.5 GHz, for example). The amplitude characteristics of signals are considerably improved as compared with those for the conventional phase inverter shown in FIG. 1. The 180° phase difference between the signals is obtained in the ±0.4$f_0$ range. In an alternative use, the terminals 31 and 33 serve as input terminals, and the terminal 30 serves as an output terminal.

FIGS. 9A through 9D respectively show variations of the aforementioned first embodiments. A variety of patterns of transmission line is shown.

The transmission lines of the aforementioned individual phase inverters have the same pattern width. For example, the transmission lines $10_1$–$10_4$ shown in FIG. 4A have the same pattern width. Similarly, as shown in FIG. 10A, networks 36–39 provided between terminals 40–43 are individually composed of two coupled lines having the same pattern width. The terminals 40–43 have the same impedance.

A modification of the phase inverter shown in FIG. 10A is illustrated in FIG. 10B. The phase inverter shown in FIG. 10B also functions as an impedance converter. The phase inverter includes networks (coupling circuits) 45, 46, 47 and 48 provided between the terminals 50, 51, 52 and 53. Each of the networks 45–48 is formed by a pair of transmission lines W1 and W2. The transmission line W1 is wider than the transmission line W2 (W1 > W2). Each of the terminals 50 and 52 has high impedance (H), and each of the terminals 51 and 53 has low impedance (L). That is, the phase inverter shown in FIG. 10B also serves as an impedance converter. When an input signal is applied to the terminal 50, 180° out-of-phase signals are drawn from the terminals 51 and 53.

A phase inverter shown in FIG.10C has networks (directional couplers) 55, 56, 57 and 58 respectively provided between the terminals 60 and 61, 61 and 62, 62 and 63, and 60 and 63. Each of the directional couplers 55-58 is formed by three transmission lines W1, W2 and W3. The transmission lines W1 and W3 having the same pattern width are mutually connected through jump wires. The transmission lines W1 and W3 are wider than the transmission line W2. Each of the terminals 60 and 62 has high impedance, and each of the terminals 61 and 63 has low impedance. That is, the phase inverter shown in FIG.10C also functions as an impedance converter.

The phase inverter shown in FIG.10B is equivalent to a phase inverter shown in FIG.10D. The phase inverter depicted in FIG.10D has the phase inverter shown in FIG.10A. A transformer 65 extends from the phase inverter to the terminal 41. The transformer 65 has two stepwise line portions 65a and 65b each having a length of $\lambda/4$. The line portion 65b connected to the terminal 41 is wider than the line portion 65a. Impedance of the terminal 41 is less than that of the terminal 40. Similarly, a transformer 66 having two line portions 66a and 66b extends from the phase inverter to the terminal 43. The terminal 43 has low impedance as compared with that of the terminal 40. The signals drawn from the terminals 41 and 43 are 180° out of phase.

Figure 11A:
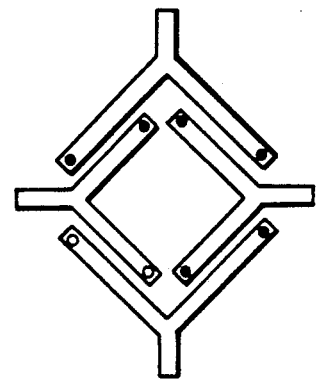
FIG.11A is a diagram of a variation of the phase inverter according to the first embodiment of the present invention.

The transmission lines shown in FIGS.4A, 4B, 9A-9D, and 10A-10D are not limited to curved transmission lines. As shown in FIG.11A, straight transmission lines can be used instead of curved transmission lines.

Figure 11B:
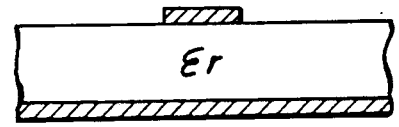
FIGS.11B through 11D are diagrams illustrating structures of transmission lines.
Figure 11C:
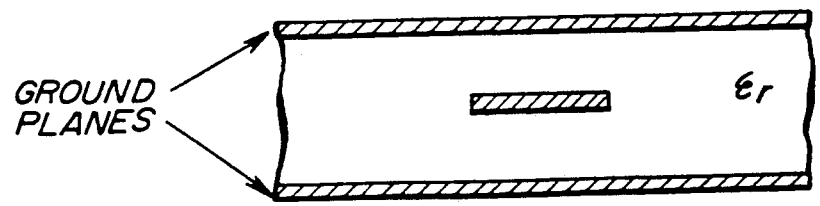
Figure 11D:
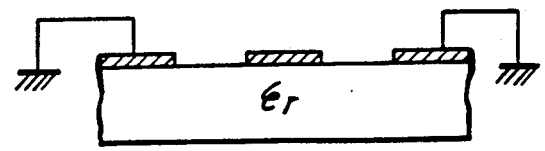

The aforementioned transmission lines are conductive patterns formed on a dielectric substrate having a dielectric constant $\epsilon_r$, as shown in FIG.11B, which illustrates a microstrip structure. Alternatively, the transmission lines are formed by a coplanar waveguide as shown in FIGS.11C and 11D. Ground planes are grounded. A signal passes through the dielectric substrate. Thus, a loss of signal is not negligible in the order of tens of giga-hertz. A waveguide directional coupler is suitable for a very-high frequency range of tens of giga-hertz or higher.

Figure 12:
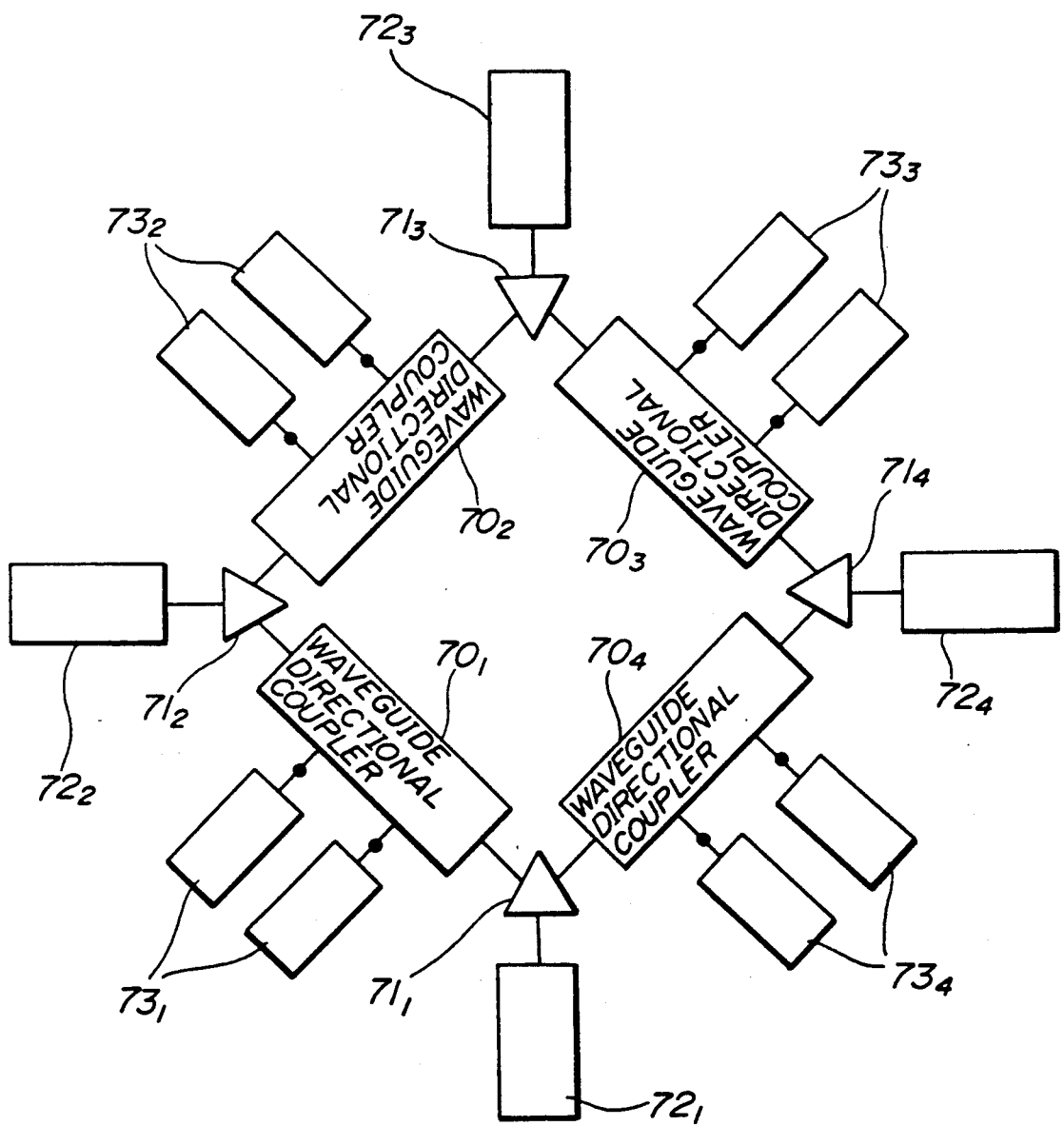
FIG.12 is a diagram illustrating the principle of a phase inverter according to a third embodiment of the present invention in which coupling circuits are formed by waveguide directional couplers.

FIG.12 is a diagram of a configuration of the phase inverter in which the coupling circuits shown in FIG.3 are formed by waveguide directional circuits. Referring to FIG.12, waveguide directional couplers $70_1$, $70_2$, $70_3$ and $70_4$ are coupled through three-branch waveguides $71_1$, $71_2$, $71_3$ and $71_4$. Terminals $72_1$, $72_2$, $72_3$ and $72_4$ are connected to the three-branch waveguides $71_1$, $71_2$, $71_3$ and $71_4$, respectively. In actuality, one of the three branches of each of the three-branch waveguides $71_1$-$71_4$ serves as the corresponding input or output terminal. Short-circuit elements $73_1$, $73_2$, $73_3$ and $73_4$ are coupled to the waveguide directional couplers $70_1$, $70_2$, $70_3$ and $70_4$, respectively. Each of the waveguide directional couplers $70_1$-$70_4$ has an input port, a main port, a couple port and an isolation port. The main port and the couple port of each of the waveguide directional couplers $70_1$-$70_4$ are short-circuited by the respective short-circuit elements $73_1$-$73_4$. The input and isolation ports are coupled to two of the three branches of the corresponding three-branch waveguides. The waveguide directional couplers $70_1$-$70_4$ have the same length. The reflection angle of each of the short-circuit elements $73_1$, $73_2$ and $73_3$ is different by 180° from the reflection angle of the short-circuit element $73_4$. An input signal is applied to the terminal $72_1$. Two output signals each having the same amplitude of the input signal are drawn from the terminals $72_2$ and $72_4$. There is the 180° difference between the signals output from the terminals $72_2$ and $72_4$.

Figure 13A:
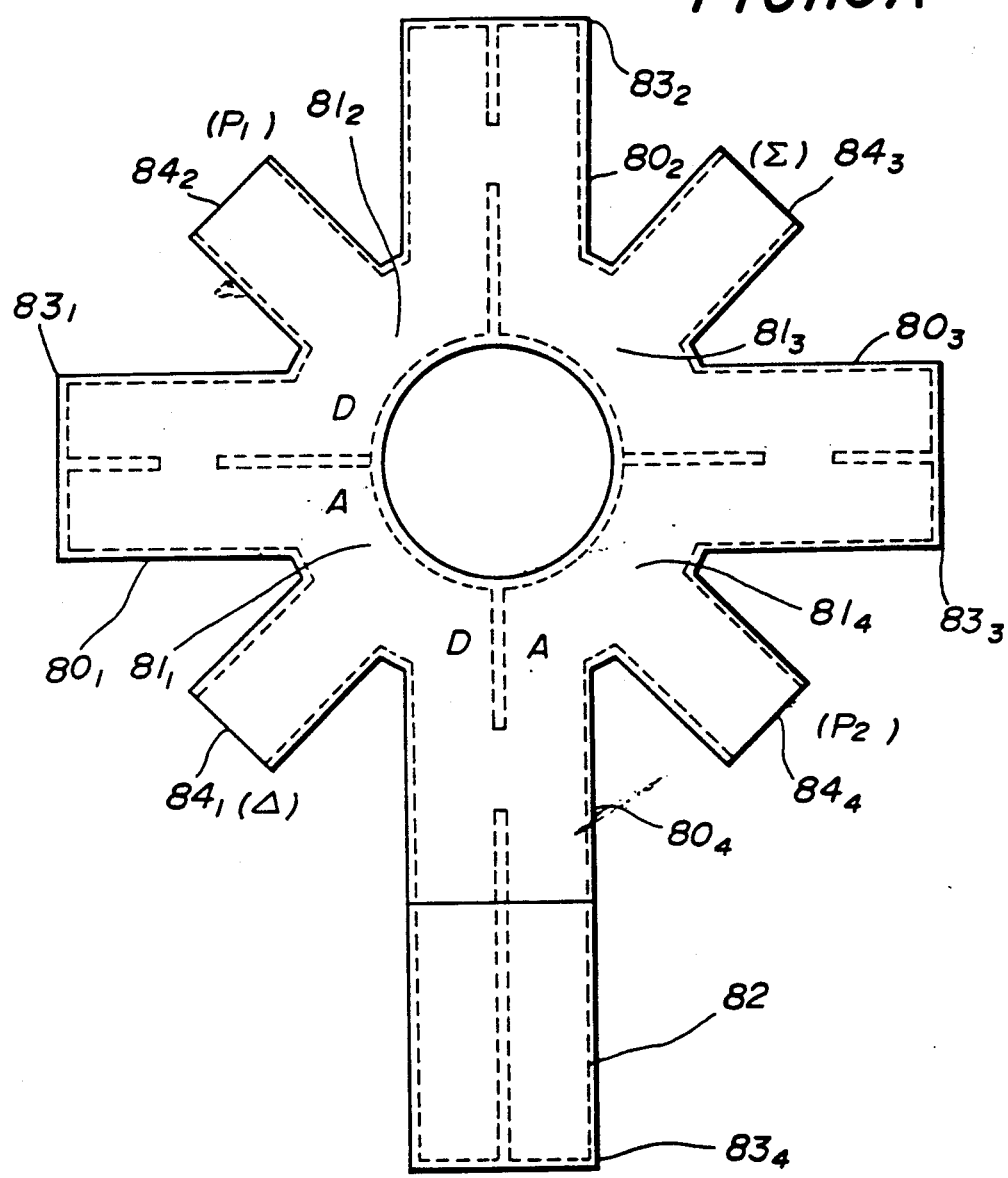
FIG.13A is a plan view of the third embodiment of the present invention.
Figure 13B:
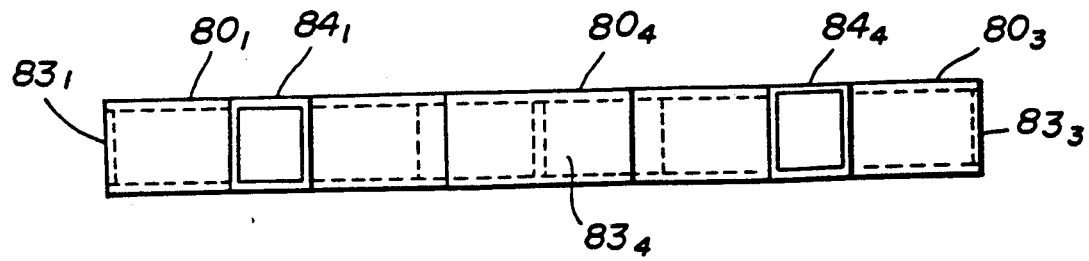
FIG.13B is a front view of the third embodiment of the present invention.

FIGS.13A and 13B are respectively plan and front views of a phase inverter according to a third embodiment of the present invention. The illustrated phase inverter uses waveguide directional couplers arranged as shown in FIG.12. Waveguide directional couplers $80_1$, $80_2$, $80_3$ and $80_4$ are of the magnetic field coupling type and correspond to the waveguide directional couplers $70_1$, $70_2$, $70_3$ and $70_4$, respectively. A broken line represents an inner wall. Three-branch waveguides $81_1$, $81_2$, $81_3$ and $81_4$ are arranged into a ring and couple the waveguide directional couplers $80_1$-$80_4$, which extend radially. An elongated waveguide 82 having a length of $\lambda_0/4$ ($\lambda_0$ is the wavelength within the waveguide 82) is directly connected to an end of the waveguide directional coupler $80_4$. Short-circuit plates $83_1$, $83_2$, $83_3$ are provided for ends of the waveguide directional couplers $80_1$, $80_2$ and $80_3$, respectively, so that the main and couple ports thereof are short-circuited. A short-circuit plate $83_4$ is provided for an end of the elongated waveguide 82 so that main and couple ports thereof are short-circuited. No short-circuit plate is fastened to the end of the waveguide directional coupler $80_4$. Terminals $84_1$, $84_2$, $84_3$ and $84_4$ are connected to the three-branch waveguides $81_1$, $81_2$, $81_3$ and $81_4$, respectively.

Each of the waveguide directional couplers $80_1$-$80_4$ has a structure as shown in FIG.14A. The one-dotted chain lines shown in FIG.14A represent the elongated waveguide 82 shown in FIG.13A. Each of the waveguide directional couplers $80_1$-$80_4$ has an input port A, a main port B, a couple port C and an isolation port D. As illustrated by the arrows, a signal input through the input port A is output through the main port B and the couple port C. Signals which are respectively input through the main port and the coupled port C are combined and then drawn through the isolation port D. A letter "S" indicates the short-circuit plate $83_4$ (a short-circuit plate provided for the end of the waveguide directional coupler is omitted for the sake of simplicity), a reference $G_M$ indicate a main guide, and a reference $G_A$ indicates an auxiliary guide, and a reference "P" indicates a plane of symmetry of magnetic field.

Turning to FIG.13A, a signal supplied to the terminal $84_1$ ($\Delta$) is equally distributed so that 180° out-of-phase signals are output from the terminals $84_2$ (P1) and $84_4$ (P2). No signal is output from the terminal $84_3$ ($\Sigma$). Alternatively, 180° out-of-phase signals supplied to the terminals $84_2$ (P1) and $84_4$ (P2) are combined so that a signal is output from the terminal $84_1$ ($\Delta$). The short-circuit plate $83_1$ is directly connected to the waveguide directional coupler $80_1$. Alternatively, a short-circuit element of a waveguide having a length l equal to $(\lambda_0/4)n$ and a short-circuit plate connected to an end thereof may be used where 'n' is an integer. When n=0, the short-circuit plate $83_1$ is directly connected to the end of the waveguide directional coupler $80_1$. When the short-circuit element of a length l equal to $(\lambda_0/4)n$ is used, the elongated waveguide 82 having a length of $\lambda_0/4$ is replaced by an elongated waveguide having a length l' of $(\lambda_0/4)(n+1)$ and having a short-circuit plate connected to an end thereof. In this alternative, there is a 180° phase difference between the path between the input port A and the isolation port D of the waveguide directional coupler $80_1$ and the path between the input port A and the isolation port D of the waveguide directional coupler $80_4$. A signal applied to the elongated waveguide 82 is reflected by the short-circuit plate $83_4$ and is then output therefrom so that a phase difference of $(\lambda_0/4) \times 2 = 180°$ can be generated.

Figure 14B:
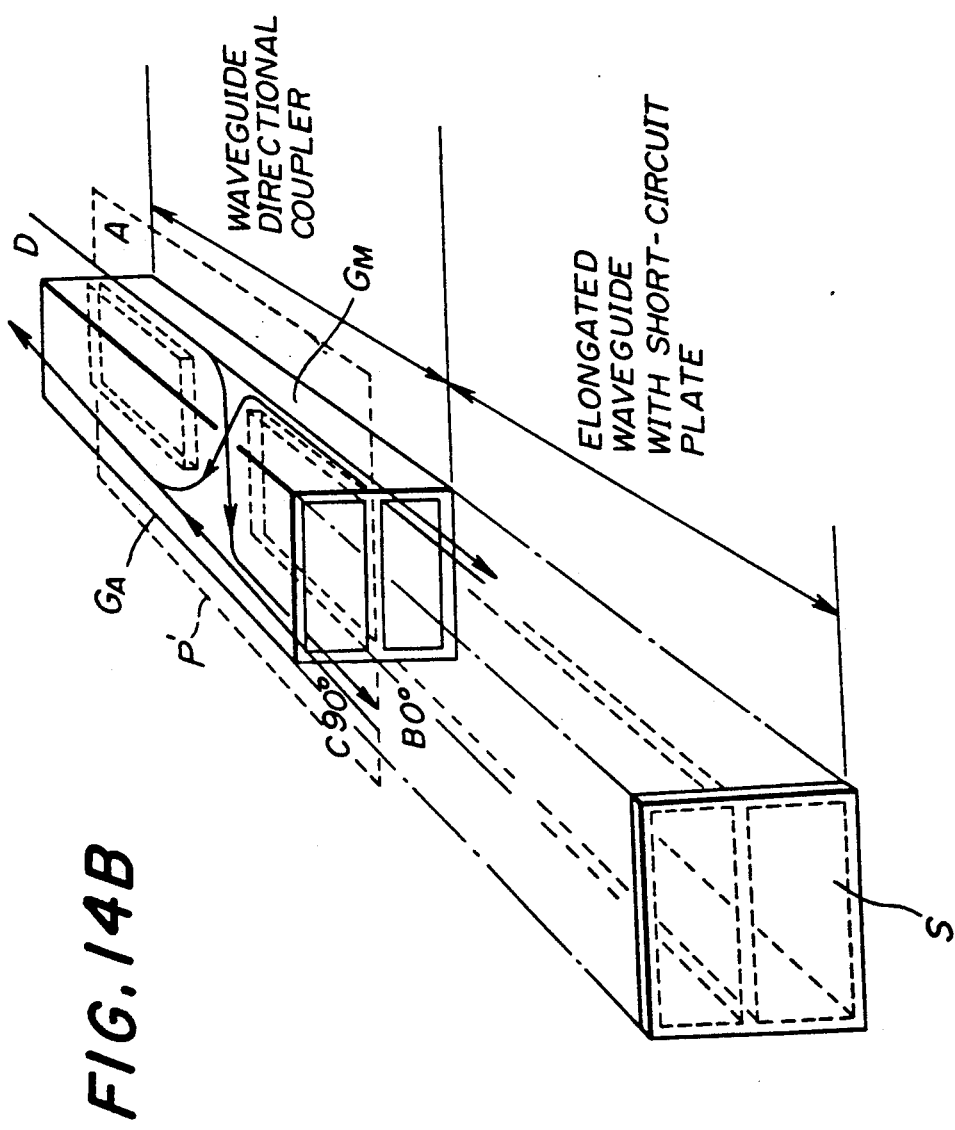
FIG.14B is a perspective view of another waveguide directional coupler used in the third embodiment of the present invention.

Alternatively, each of the waveguide directional couplers $70_1$-$70_4$ (FIG.12) may be formed by an electric field coupling type waveguide directional coupler as shown in FIG.14B, in which those parts which have the same functions as those in FIG.14A are given the same reference numbers. The waveguide directional coupler shown in FIG.14A has two waveguides arranged side by side. On the other hand, the waveguide directional coupler shown in FIG.14B has waveguides elevationally stacked.

Figure 15A:
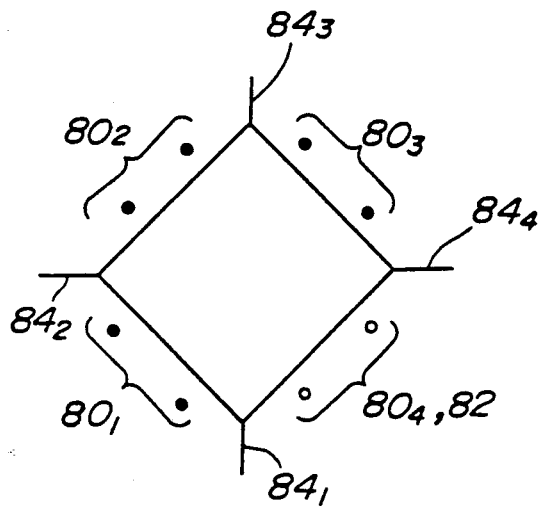
FIGS.15A and 15B are diagrams showing the types of the third embodiment.
Figure 15B:
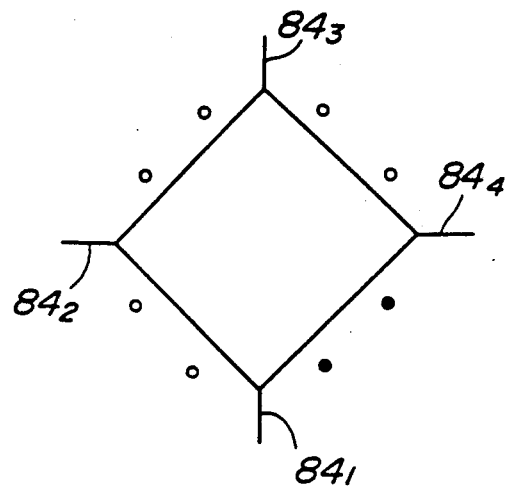

FIG.15A is diagram showing the type of each of the waveguide directional couplers shown in FIGS.13A and 13B. Each of the waveguide directional couplers $80_1$, $80_2$ and $80_3$ is of the double-end grounded type, and the combination of the waveguide directional coupler $80_4$ and the elongated waveguide 82 having the short-circuit plate $83_4$ (elongated waveguide short-circuit element) is of the double-end open type. Alternatively, as shown in FIG.15B, it is possible to employ three waveguide directional couplers of the double-end open type and a waveguide directional coupler of the double-end grounded type. In the alternative, a $\lambda_0/4$ elongated waveguide having a short-circuit plate is directly connected to an end of each of the waveguide directional coupler of the double-end open type, and a short-circuit plate is directly connected to an end of the remaining waveguide directional plate of the double-end grounded type. It can be seen from the above description that the third embodiment of the present invention has four variations. The first and second variations are phase inverters having the arrangement shown in FIG.-15A in which the waveguide directional couplers are of the magnetic field coupling type and the electric field coupling type. The third and fourth variations are phase inverters having the arrangement shown in FIG.15B in which the waveguide directional couplers are of the magnetic field coupling type and the electric field coupling type.

Figure 16:
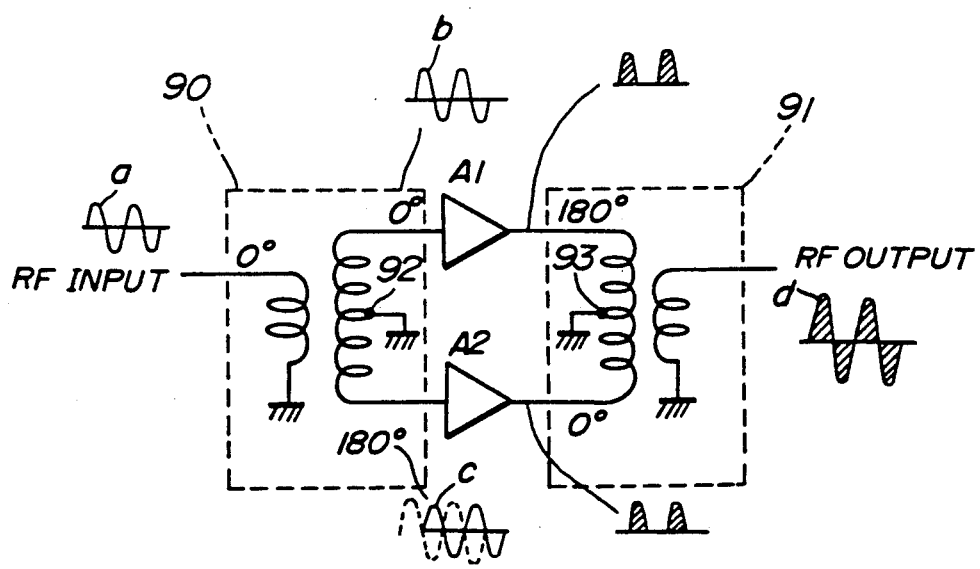
FIG.16 is a circuit diagram of a push-pull amplifier to which the phase inverter of the present invention is applied.

FIG.16 is a circuit diagram of a push-pull amplifier which uses two phase inverters according to the present invention. The illustrated push-pull amplifier has two phase inverters 90 and 91 configured according to the present invention. The phase inverter 90 has a single input terminal and two output terminals, and the phase inverter 91 has two input terminals and a single output terminal. An amplifier A1 is provided between one of the two output terminals of the phase inverter 90 and one of the two input terminals of the phase inverter 91. An amplifier A2 is provided between the other output terminal of the phase inverter 90 and the other input terminal of the phase inverter 91. An RF (radio frequency) signal a is applied to the phase inverter 90, which outputs two output signals b and c having a phase difference of 180°. The signals b and c are amplified by the amplifiers A1 and A2, respectively, and supplied to the phase inverter 91. The amplified signals b and c are combined by the phase inverter 91, which generates an RF output signal d. The amplifiers A1 and A2 are B-class amplifiers. Thus, each of the amplifiers A1 and A2 amplifies either one of the polarities of the amplified signals b and c. The phase of amplified signal b is inverted by 180° by the phase inverter 91 so that the RF output signal d has both the polarities. The phase inverters 90 and 91 have middle-point ground terminals 92 and 93, respectively so that the reference D.C. level of the output signal b is equal to that of the output signal c.

Figure 17:
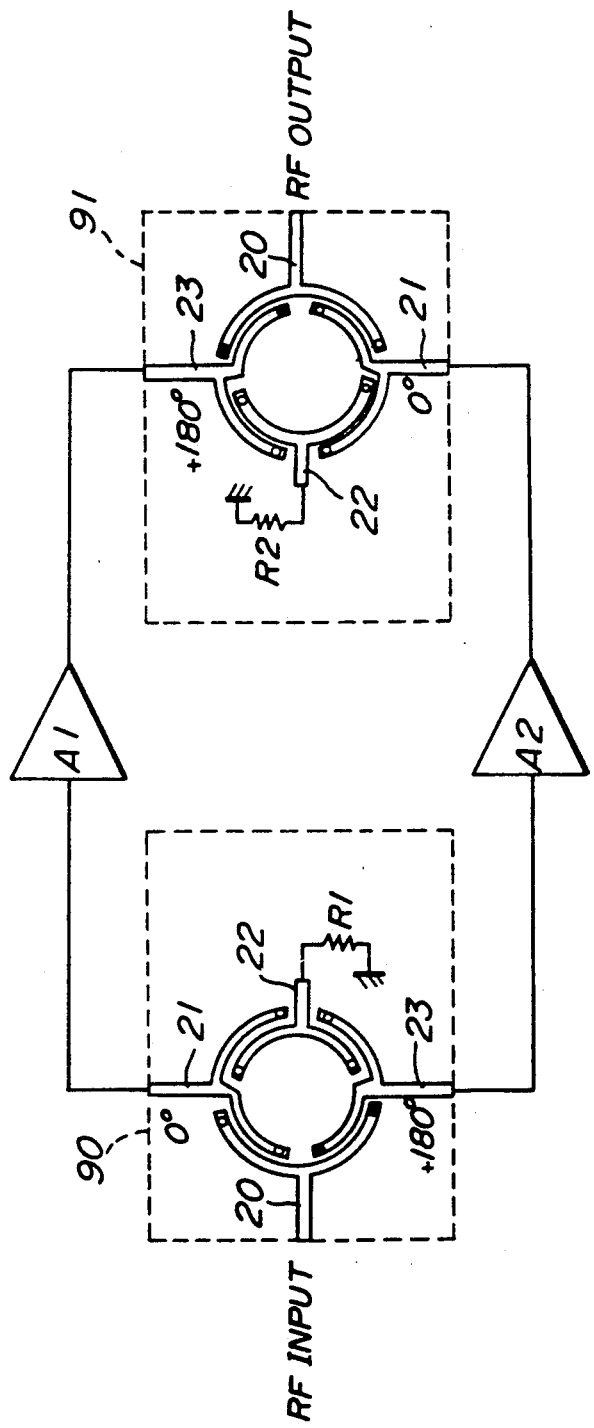
FIG.17 is a diagram illustrating a first configuration of the push-pull amplifier according to the present invention.

FIG.17 is a diagram of a push-pull amplifier in which the phase inverters 90 and 91 are formed by $\lambda/4$ parallel coupled line networks according to the first embodiment of the present invention. Each of the phase inverters has one grounded-coupled line network between the terminals 21 and 23. Thus, it is considered that a middle-point ground terminal is substantially provided between the networks provided between the terminals 21 and 23. The terminal 22 of the phase inverter 90 which is grounded through a resistor R1 (having a resistance of 50 ohms, for example) corresponds to the middle-point ground terminal 92 shown in FIG.16. The terminal 22 of the phase inverter 91 which is grounded through a resistor R2 (having a resistance of 50 ohms, for example) corresponds to the middle-point ground terminal 93 shown in FIG.16. An RF signal is applied to the terminal 20 of the phase inverter 90. The B-class amplifier A1 is connected between the terminal 21 of the phase inverter 90 and the terminal 23 of the phase inverter 91. The B-class amplifier A2 is connected between the terminal 23 of the phase inverter 90 and the terminal 21 of the phase inverter 91. The RF output signal is drawn from the terminal 20 of the phase inverter 91.

Figure 18:
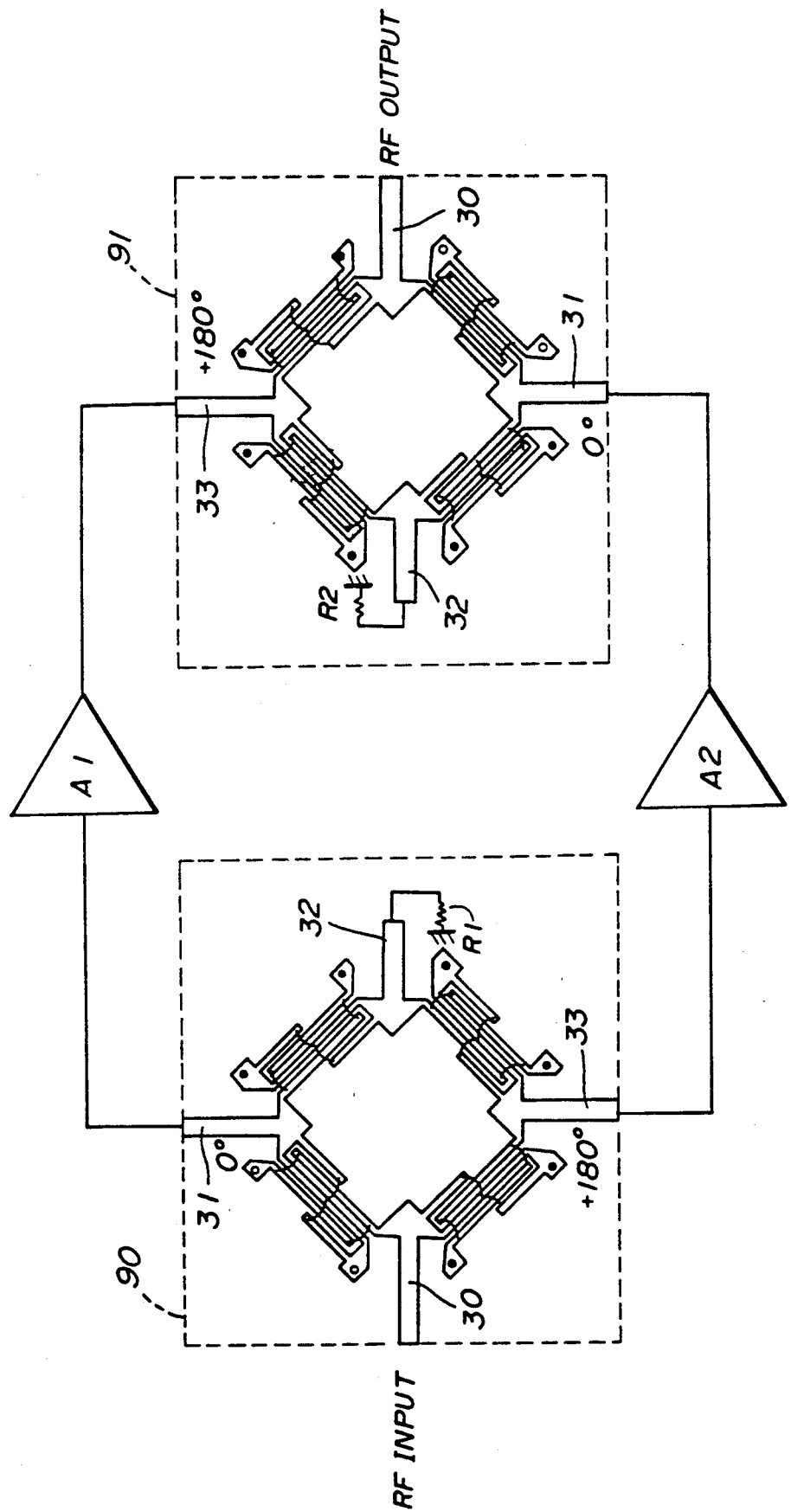
FIG.18 is a diagram illustrating a second configuration of the push-pull amplifier according to the present invention.

FIG.18 is a diagram of a push-pull amplifier in which the phase inverters 90 and 91 are formed by directional couplers according to the second embodiment of the present invention. An RF input signal is applied to the terminal 30 of the phase inverter 90, which outputs 180° out-of-phase signals through the terminals 31 and 33. The signals drawn from the terminals 31 and 33 pass through the B-class amplifier A1 and A2, and then are applied to the terminals 33 and 31 of the phase inverter 91, respectively. The RF signal is drawn from the terminal 30 the phase inverter 91. The terminals 32 of the phase inverters 90 and 91 are grounded through the resistors R1 and R2, respectively. The terminals 32 of the phase inverters 90 and 91 correspond to the middle-point ground terminals 92, and 93, respectively.

Figure 19:
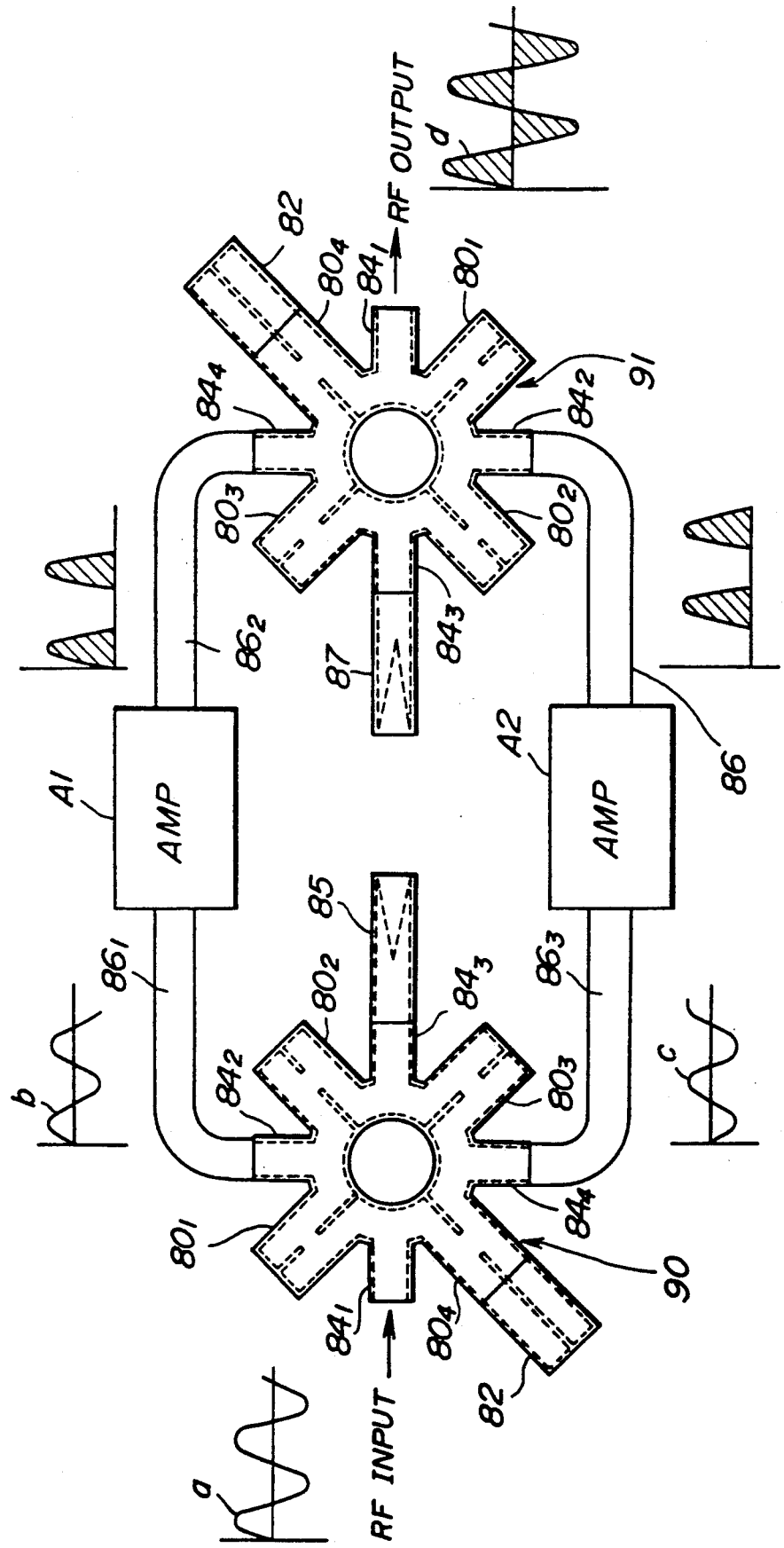
FIG.19 is a diagram illustrating a third configuration of the push-pull amplifier according to the present invention.

FIG.19 is a diagram of a push-pull amplifier in which the phase inverters 90 and 91 are formed by waveguide directional couplers according to the third embodiment of the present invention. An RF input signal is applied to one of the three branches of the three-branch waveguide $84_1$ of the phase inverter 90. One of the three branches of the three-branch waveguide $84_2$ is coupled to the B-class amplifier A1 through a waveguide $86_1$. One of the three branches of the three-branch waveguides $84_4$ of the phase inverter 90 is coupled to the B-class amplifier A2 through a waveguide $86_3$. A non-reflection terminator 85 having a resistance of 50 ohms is connected to one of the three branches of the three-branch waveguide $84_3$ of the phase inverter 90. The B-class amplifier A1 is connected to one of the three branches of the three-branch waveguide $84_4$ of the phase inverter 91 through a waveguide $86_2$, and the B-class amplifier A2 is connected to one of the three-branches of the three-branch waveguide $84_2$ of the phase inverter 91 through a waveguide $86_4$. A non-reflection terminator 87 having a resistance of 50 ohms is connected to the one of the three branches of the three-branch waveguide $84_3$ of the phase inverter 91. The short-circuit elements $73_1$, $73_2$, $73_3$ and $73_4$ (FIG.12) serving as the middle-point ground terminals 92 and 93

(FIG.16) are provided so that the reference D.C. level of the output signal b is equal to that of the output signal c.

The present invention is applied to not only the push-pull amplifier but also a mixer, a mono-pulse comparator and the like.

The present invention is not limited to the aforementioned embodiments, and variations and modifications may be made without departing from the scope of the present invention.

What is claimed is:

1. A phase inverter comprising:
   first, second, third and fourth terminals;
   a first coupling circuit of a first length coupled between said first and second terminals and having two ends terminated in a first manner;
   a second coupling circuit of a length substantially identical to the first length coupled between said second and third terminals and having two ends terminated in a second manner;
   a third coupling circuit of a length substantially identical to the first length coupled between said third and fourth terminals and having two ends terminated in a third manner;
   a fourth coupling circuit of a length substantially identical to the first length coupled between said fourth and first terminals and having two ends terminated in a fourth manner;
   said first to fourth terminals and said first to fourth coupling circuits being arranged into a ring;
   the first manner being different from the fourth manner, and the second and third manners being identical;
   wherein two output signals having a phase difference of 180° are drawn from said second and fourth terminals when an input signal is applied to said first terminal, and an output signal is drawn from said first terminal when two input signals having a phase difference of 180° are applied to said second and fourth terminals.

2. A phase inverter as claimed in claim 1, wherein the first manner includes the two ends of said first coupling circuit being open, and the fourth manner includes the two ends of said fourth coupling circuit being grounded.

3. A phase inverter as claimed in claim 1, wherein the first manner includes the two ends of said first coupling circuit being grounded, and the fourth manner includes the two ends of said fourth coupling circuit being open.

4. A phase inverter as claimed in claim 1, wherein the first and second manners includes the respective two ends of said second and third coupling circuit being open.

5. A phase inverter as claimed in claim 1, wherein the first and second manners includes the respective two ends of said second and third coupling circuit being grounded.

6. A phase inverter as claimed in claim 1, wherein each of said first to fourth coupling circuits comprises two coupled lines each having a length of λ/4 where λ is a wavelength of each of said input and output signals.

7. A phase inverter as claimed in claim 1, wherein each of said first to fourth coupling circuits comprises three or more λ/4 interdigital coupled lines where λ is a wavelength of each of said input and output signals.

8. A phase inverter as claimed in claim 1, wherein each of said first to fourth coupling circuits comprises a directional coupler.

9. A phase inverter as claimed in claim 6, wherein said two coupled lines have an identical width.

10. A phase inverter as claimed in claim 6, wherein one of said two coupled lines is wider than the other coupled line.

11. A phase inverter as claimed in claim 1, wherein:
    each of said first to fourth coupling circuits has a first line and a second line wider than said first line,
    said first and second lines each have a length of λ/4 where λ is a wavelength of each of said input and output signals and are arranged in parallel to thereby form coupled lines,
    said first line of each of said first and fourth coupling circuit is coupled to said first terminal,
    said first line of each of said second and third coupling circuit is connected to said third terminal,
    said second line of each of said first and second coupling circuits is coupled to said second terminal,
    said second line of each of said third and fourth coupling circuits is coupled to said fourth terminal, and
    an impedance of each of said second and fourth terminals is lower than that of each of said first and third terminals.

12. A phase inverter as claimed in claim 1, wherein:
    each of said first to fourth coupling circuits has a first group of lines mutually connected,
    a second group of lines mutually connected,
    the lines of said first and second groups have an interdigital arrangement,
    the lines of said second group are wider than the lines of said first group,
    said first group of lines of each of said first and fourth coupling circuit is coupled to said first terminal,
    said first group of lines of each of said second and third coupling circuit is connected to said third terminal,
    said second group of lines of each of said first and second coupling circuits is coupled to said second terminal,
    said second group of lines of each of said third and fourth coupling circuits is coupled to said fourth terminal, and
    an impedance of each of said second and fourth terminals is lower than that of each of said first and third terminals.

13. A phase inverter as claimed in claim 1, wherein said first to fourth coupling circuits respectively comprises first to fourth waveguide directional couplers each having a short-circuit element and having input, main, couple and isolation ports, and first to fourth branch waveguides each having first, second and third branches, and wherein:
    said first branch waveguide couples said first and fourth waveguide directional couplers through said input and isolation ports thereof and said first and second branches of said first branch waveguide, the third branch thereof serving as said first terminal,
    said second branch waveguide couples said first and second waveguide directional couplers through said input and isolation ports and said first and second branches of said second branch waveguide, the third branch thereof serving as said second terminal,
    said third branch waveguide couples said second and third waveguide directional couplers through said input and isolation ports thereof and said first and second branches of said third branch waveguide, the third branch thereof serving as said third terminal, said fourth branch waveguide couples said third and fourth waveguide directional couplers through said input and isolation ports and said first and second branches of said fourth branch waveguide, the third branch thereof serving as said fourth terminal, and said short-circuit element is provided for said main and couple ports of each of said first to fourth waveguide directional couplers.

14. A phase inverter as claimed in claim 13, wherein said short-circuit element for said fourth waveguide directional coupler has an elongated waveguide directly coupled to said main and couple ports of said fourth waveguide directional coupler, and a short-circuit plate which short-circuits said elongated waveguide, and wherein said short-circuit element for each of said first to third waveguide directional couplers includes a short-circuit element which short-circuits said main and couple ports of each of said first to third waveguide directional couplers.

15. A phase inverter as claimed in claim 13, wherein said short-circuit element provided for each of said first to third waveguide directional couplers includes an elongated waveguide directly coupled to said main and couple ports thereof and a short-circuit plate short-circuiting said elongated waveguide, and wherein said short-circuit element provided for said fourth waveguide directional coupler includes a short-circuit plate which short-circuits said main and couple ports thereof.

16. A phase inverter as claimed in claim 14, wherein said elongated waveguide has a length corresponding to the 180° phase difference between said first and fourth terminals.

17. A phase inverter as claimed in claim 15, wherein each of said elongated waveguides has a length corresponding to the 180° phase difference between said first and fourth terminals.

18. A phase inverter as claimed in claim 13, wherein each of said first to fourth waveguide directional couplers is selected from the group consisting of a magnetic field coupling type waveguide directional coupler and an electric field coupling type waveguide directional coupler.

19. A push-pull amplifier comprising:

a first phase inverter having an input terminal receiving an input signal and two output terminals;

a second phase inverter having two input terminals and an output terminal outputting an output signal;

a first amplifier coupled between one of said two output terminals of said first phase inverter and one of two input terminals of said second phase inverter; and a second amplifier coupled between the other output terminal of said first phase inverter and the other input terminal of said second phase inverter, each of said first and second phase inverters including:

first, second, third and fourth terminals;

a first coupling circuit of a first length coupled between said first and second terminals and having two ends terminated in a first manner;

a second coupling circuit of a length substantially identical to the first length coupled between said second and third terminals and having two ends terminated in a second manner;

a third coupling circuit of a length substantially identical to the first length coupled between said third and fourth terminals and having two ends terminated in a third manner;

a fourth coupling circuit of a length substantially identical to the first length coupled between said fourth and first terminals and having two ends terminated in a fourth manner;

said first to fourth terminals and said first to fourth coupling circuits being arranged into a ring;

the first manner being different from the fourth manner, and the second and third manners being identical;

said first, second, and fourth terminals of said first phase inverter being said input terminal and said two output terminals thereof, respectively, said first, second and fourth terminals of said second phase inverter being said two input terminals and said output terminal thereof, respectively, and said third terminals of said first and second phase inverters being grounded through first and second resistors, respectively.

20. A push-pull amplifier as claimed in claim 19, wherein the first manner includes the two ends of said first coupling circuit being open, and the fourth manner includes the two ends of said fourth coupling circuit being grounded.

21. A push-pull amplifier as claimed in claim 19, wherein the first manner includes the two ends of said first coupling circuit being grounded, and the fourth manner includes the two ends of said fourth coupling circuit being open.

22. A push-pull amplifier as claimed in claim 19, wherein the first and second manners includes the respective two ends of said second and third coupling circuit being open.

23. A push-pull amplifier as claimed in claim 19, wherein the first and second manners includes the respective two ends of said second and third coupling circuit being grounded.

24. A push-pull amplifier as claimed in claim 19, wherein each of said first to fourth coupling circuits comprises two coupled lines each having a length of $\lambda/4$ where $\lambda$ is a wavelength of each of said input and output signals.

25. A push-pull amplifier as claimed in claim 19, wherein each of said first to fourth coupling circuits comprises three or more $\lambda/4$ interdigital coupled lines where $\lambda$ is a wavelength of each of said input and output signals.

26. A push-pull amplifier as claimed in claim 19, wherein each of said first to fourth coupling circuits comprises a directional coupler.

27. A push-pull amplifier as claimed in claim 19, wherein each of said first to fourth coupling circuits comprises a waveguide directional amplifier.

28. A push-pull amplifier as claimed in claim 19, wherein each of said first and second amplifiers has a B-class amplifying function.

* * * * *

UNITED STATES PATENT AND TRADEMARK OFFICE
CERTIFICATE OF CORRECTION

PATENT NO. : 5,107,223

DATED : April 21, 1992   PAGE 1 of 2

INVENTOR(S) : Sakai et al.

It is certified that error appears in the above-identified patent and that said Letters Patent is hereby corrected as shown below:

Title page, "OTHER PUBLICATIONS", "Wave" should be --wave--.

[57] ABSTRACT, line 14, "terminal" (first occurrence) should be --signal--;

line 18, "inverter" should be --inverters--.

Col. 1, line 60, "board" should be --broad--.
Col. 2, line 25, "terminal" (first occurrence) should be --terminals--; "terminal" (second occurrence) should be --signal--.

Col. 8, line 40, "coupled" should be --couple--.
line 45, "indicate" should be --indicates--;
lines 57, 62 and 65, "l" should be --$\ell$--;

Col. 9, line 37, "FIG.-" should be --FIG.--.

Col. 10, line 3, "respectively" should be --respectively,--;
line 43, "92," should be --92--;
line 61, "three-" should be --three--.

UNITED STATES PATENT AND TRADEMARK OFFICE
CERTIFICATE OF CORRECTION

PATENT NO. : 5,107,223

DATED : April 21, 1992

INVENTOR(S) : Sakai et al.

It is certified that error appears in the above-identified patent and that said Letters Patent is hereby corrected as shown below:

Col. 11, lines 51 and 55, "includes" should be --include--;
lines 52 and 56, "circuit" should be --circuits--.

Col. 12, lines 14, 16, 33 and 35, "circuit" should be --circuits--.

Col. 14, lines 40 and 44, "circuit" should be --circuits--.

Signed and Sealed this

Twenty-first Day of September, 1993

Attest:

BRUCE LEHMAN

Attesting Officer

Commissioner of Patents and Trademarks